United States Patent
Suda et al.

(10) Patent No.: US 11,171,012 B1
(45) Date of Patent: Nov. 9, 2021

(54) METHOD AND APPARATUS FOR FORMATION OF PROTECTIVE SIDEWALL LAYER FOR BOW REDUCTION

(71) Applicant: Tokyo Electron Limited, Tokyo (JP)

(72) Inventors: Ryutaro Suda, Miyagi (JP); Kae Kumagai, Miyagi (JP); Maju Tomura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/884,063

(22) Filed: May 27, 2020

(51) Int. Cl.
  *H01L 21/3065* (2006.01)
  *H01L 21/311* (2006.01)
  *H01L 21/67* (2006.01)
  *H01J 37/32* (2006.01)
  *H01L 21/02* (2006.01)

(52) U.S. Cl.
  CPC .... *H01L 21/31116* (2013.01); *H01J 37/3244* (2013.01); *H01J 37/32091* (2013.01); *H01L 21/022* (2013.01); *H01L 21/3065* (2013.01); *H01L 21/67069* (2013.01)

(58) Field of Classification Search
  None
  See application file for complete search history.

(56) References Cited

U.S. PATENT DOCUMENTS

| | | | | |
|---|---|---|---|---|
| 5,268,070 A | * | 12/1993 | Nagayama | H01L 21/3065 257/E21.218 |
| 7,563,379 B2 | * | 7/2009 | Suzuki | B81C 1/00531 216/2 |
| 7,622,394 B2 | * | 11/2009 | Ikegami | H01L 21/02057 438/719 |
| 2002/0179570 A1 | * | 12/2002 | Mathad | H01L 21/3065 216/67 |
| 2015/0064921 A1 | * | 3/2015 | Nemani | H01J 37/32715 438/715 |
| 2015/0072508 A1 | * | 3/2015 | Or | H01L 21/324 438/466 |
| 2016/0329243 A1 | * | 11/2016 | Chiu | H01L 21/31111 |
| 2017/0372916 A1 | | 12/2017 | Kudo et al. | |
| 2018/0286695 A1 | * | 10/2018 | Sako | H01L 21/67069 |
| 2019/0027371 A1 | * | 1/2019 | Yamasaki | H01J 37/3244 |
| 2019/0131140 A1 | * | 5/2019 | Sun | H01L 21/31122 |
| 2020/0066540 A1 | * | 2/2020 | Hudson | H01L 21/31116 |
| 2020/0098586 A1 | * | 3/2020 | Xia | H01L 21/67069 |
| 2020/0105604 A1 | * | 4/2020 | Lin | H01L 27/0886 |
| 2020/0126804 A1 | * | 4/2020 | Dole | H01L 21/67126 |
| 2021/0035814 A1 | * | 2/2021 | Omi | B08B 7/04 |
| 2021/0057266 A1 | * | 2/2021 | Yadav | H01L 21/67248 |

FOREIGN PATENT DOCUMENTS

JP  2010-165954 A  7/2010

* cited by examiner

Primary Examiner — Shamim Ahmed
(74) Attorney, Agent, or Firm — Xsensus LLP

(57) ABSTRACT

A substrate processing apparatus performs a method of etching a substrate that includes etching the substrate to form a first portion of a recess in the substrate, the first portion of the recess including a bottom surface and a sidewall. The method also includes forming an ammonium fluorosilicate (AFS) layer in or on the sidewall, and then etching the bottom surface to form a second portion of the recess. The etching the bottom surface is performed while maintaining protection of the sidewall with the AFS layer.

18 Claims, 7 Drawing Sheets

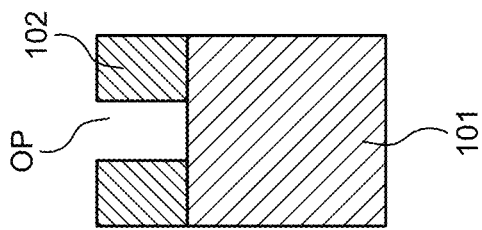
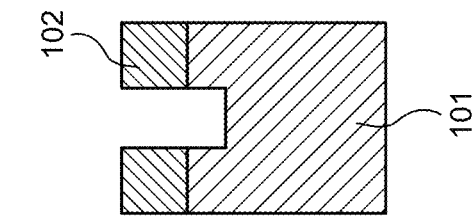
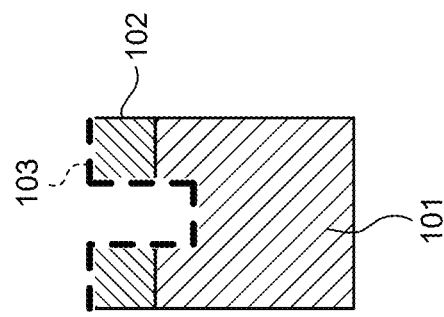
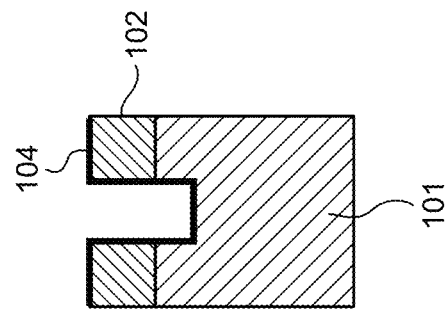
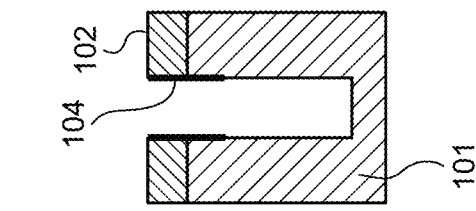

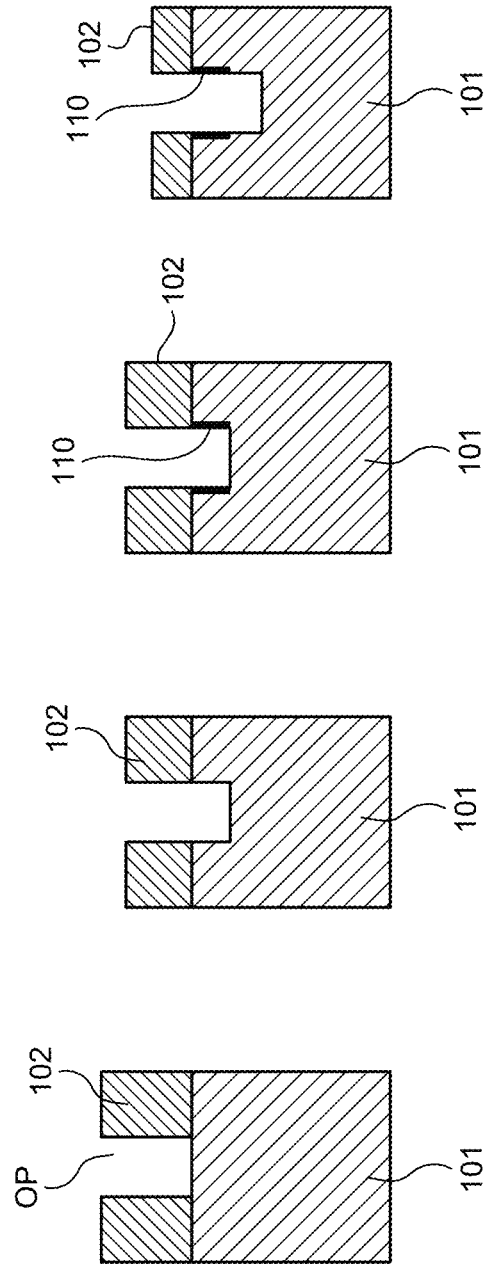

METHOD AND APPARATUS FOR FORMATION OF PROTECTIVE SIDEWALL LAYER FOR BOW REDUCTION

TECHNICAL FIELD

The present disclosure relates to semiconductor manufacturing equipment and is generally directed to a method and an apparatus for processing substrates. More particularly, the disclosure relates to systems and methods that perform high aspect ratio etching while making devices such as 3d NANDs and DRAMs, and especially systems that support high aspect ratio etching while suppressing sidewall-etch, bowing.

BACKGROUND

Over time, semiconductor fabrication methods have improved with the introduction of new technologies, and as a consequence, the size of integrated circuits (ICs, microelectronic circuits, microchips, or simply "chips") fabricated as a single unit, as well as the feature sizes of components on the IC have also reduced. Miniaturized active and passive semiconductor devices, as well as interconnections are fabricated on a semiconductor substrate wafer (e.g., silicon). To form the ICs, the wafer is subjected to numerous processes, such as doping, ion implantation, etching, thin-film deposition of various materials, and photolithographic patterning. Finally, the individual microcircuits are separated by wafer dicing and then individually packaged as ICs.

Particular process steps employed in forming ICs on a substrate include Atomic Layer Deposition (ALD), Chemical Vapor Deposition (CVD) and Atomic Layer Etching (ALE). In a certain conventional process, an etching condition is changed according to a depth of a formed pattern. For example, in some conventional process, chamber pressure, RF power, flow ratio of the process gases are changed according to the depth of the formed pattern.

US2017/0372916 describes a conventional approach to performing High Aspect Ratio (HAR) etching in a 3D-stack semiconductor memory.

JP2010165954 describes a process for removing a native oxide film that is present on a substrate.

SUMMARY

According to an embodiment, a substrate processing apparatus performs a method of etching a substrate that includes etching the substrate to form a first portion of a recess, as an etched feature, in the substrate, the first portion of the recess including a bottom surface and a sidewall. The method also includes forming an ammonium fluorosilicate (AFS) layer in or on the sidewall, and then etching the bottom surface to form a second portion of the recess. The etching the bottom surface is performed while maintaining protection of the sidewall with the AFS layer.

The foregoing paragraph has been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings.

FIGS. 4A-4E are a series of diagrams illustrating changes to a substrate according to successive process steps performed according to a first embodiment of the present disclosure.

FIGS. 5A-5D are a series of diagrams illustrating changes to a substrate according to successive process steps performed according to a second embodiment of the present disclosure.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Figure 1:
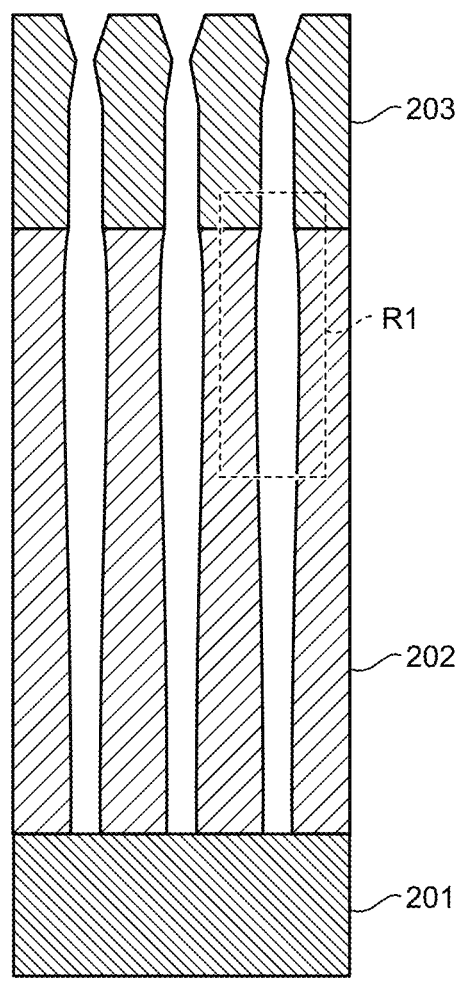
FIG. 1 is a diagram showing a high aspect ratio recess of a semiconductor device that exhibits bowing on sidewalls.

The present inventors recognized that performing high aspect ratio (HAR) etching without creating a "bowing" effect on the sidewalls of an etched feature, becomes increasingly more difficult as the dimensions of a stacked structure become increasingly extended. The present disclosure uses "recess" as a type of etched feature throughout the present disclosure, and the two terms will be used interchangeably herein. For example, in a 3D NAND, a stack structure is formed of alternating film depositions, often alternating SiO and SiN layers. The stack resembles somewhat of a skyscraper with many memory cells formed on each floor, and many floors in the skyscraper. Deep etching is needed to define channels between cells, and ideally the etch is of uniform hole size for all layers in the stack. If not done properly, a lack of uniformity of particular holes takes various forms, including bowing, as shown in region R1 of the stack 202 in FIG. 1. The bowing is a consequence of over-etching of sidewalls, especially at the upper portion of the stack 202. The bowing may be a consequence of ion scatter from faceted edges of a mask that has been exposed to significant etch time. Although ion in a HAR are oriented in a highly rectilinear fashion, some of the ions ricochet off the faceted edges of the mask, and thus are sent into the sidewall in region R1. Moreover, as shown in FIG. 1, a mask (amorphous carbon layer) 203 is disposed over stack 202, which in turn is formed on substrate 201. As a consequence of resist mask facet angle, over-etching of sidewalls at the upper portion of the stack 202 gives rise to bowing in the critical dimension (hole diameter), which in turn leads to non-uniformity of the critical dimension along an entirety of a depth of the hole. This bowing is therefore to be avoided so consistency in memory cell viability and performance can be maintained.

A configuration of the substrate processing apparatus SA according to an exemplary embodiment of the present disclosure will be described with reference to FIG. 2. Substrate processing apparatus SA includes transfer module TM (that operates at a reduced pressure with respect to the processing modules PMx). The transfer module TM includes a transfer robot module TMR to transport a wafer W to and from plasma etching modules PM1, PM2, PM3, and PM4. The transfer module TM has a vacuum transportation chamber that interfaces with load lock chambers LL1, LL2. The plasma etching modules PM1, PM2, PM3, and PM4 are connected to the Transport module TM and partitioned from load lock chambers LL1, LL2. While four plasma etching modules are shown (PM1-PM4), other configurations may be adopted as well. For example, one or more of the plasma etching modules may be substituted for a stocker/changer used as a repository for wafers and tools, such as electrostatic chucks including portions of replacement upper portions of electrostatic chucks. The stocker may be positioned in any one of positions occupied by the plasma etching modules PM1, PM2, PM3, and PM4, or on the other face, remote from the TM, of each of the reaction chambers.

Each plasma etching module PM1-PM4 may be configured as an ICP apparatus, although other reaction chambers such as capacitively coupled plasma (CCP) apparatus may be one or more of the plasma etching modules. The substrate processing as described herein may be performed in any one of the plasma etching modules PM1, PM2, PM3, and PM4. However, as an alternative, the plasma etching modules PM1, PM2, PM3, and PM4 may be used in a collaborative manufacturing processes, where, for example, PM1 is used for forming an ammonium fluorosilicate (AFS) layer, etching is performed in PM2, and AFS removal is performed in PM3, where PM3 serves as a controlled heating chamber. As a further alternative, AFS formation is divided between PM1 and PM2, where PM1 forms $SiO_x$ layer, and PM2 forms AFS based on $SiO_x$ as a starting material. Etching may then be performed in PM3, and PM4 is used for removal of residual AFS via heating. The above examples are merely illustrative and all combinations are possible, recognizing that the transfer robot module TMR may be controlled by the controller MC to move a particular wafer between PMs when the process is distributed across PMs, or all steps are performed in a single PM, or a hybrid combination thereof.

Load lock chambers LL1, LL2 provide a way to compartmentalize environments between the transfer module TM and the loader module LM. The loader module LM has a carrier placing table in which a carrier is placed. The carrier holds, for example, twenty five wafers W and when moved in and out of the substrate processing apparatus SA is placed on a front surface of the loader module LM. The loader robot module LMR transports wafers between the carrier placing table and the load lock chambers LL1, LL2. Carriers are exchanged in respective load ports LP1, LP2, LP3, and LP4 (for LPs in this example).

Figure 7:
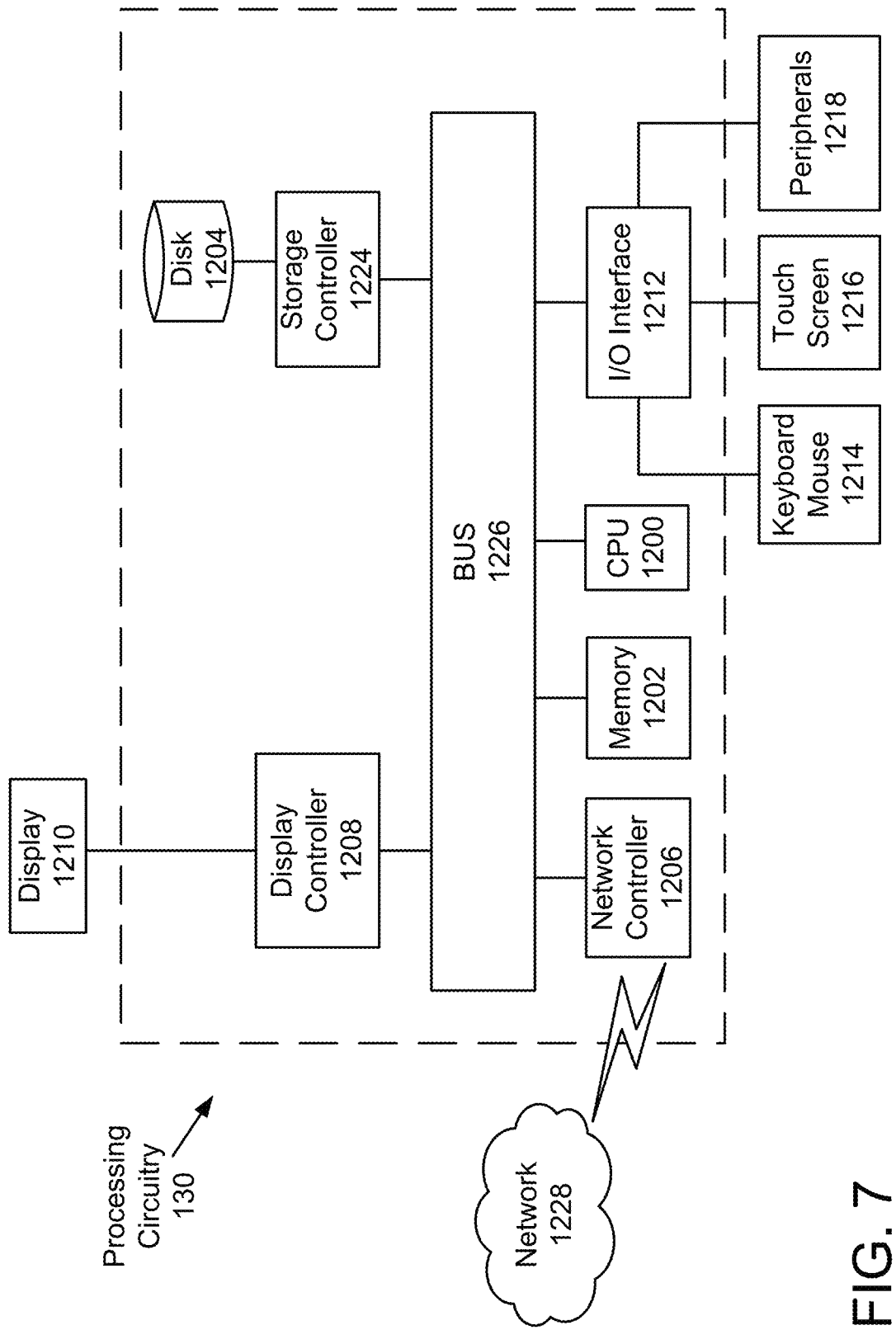
FIG. 7 is a diagram of controller circuitry that performs computer-based operations described herein.

The controller MC, in this example is a microcontroller, although a computer (local dedicated computer, or distributed computer) such as that described in FIG. 7 may be used as an alternative of controller circuitry that is configured by computer code to perform control operations described herein. Moreover, the controller MC controls operations of the substrate processing apparatus SA, including the execution of a process recipe consistent with the process steps described herein.

Figure 3:
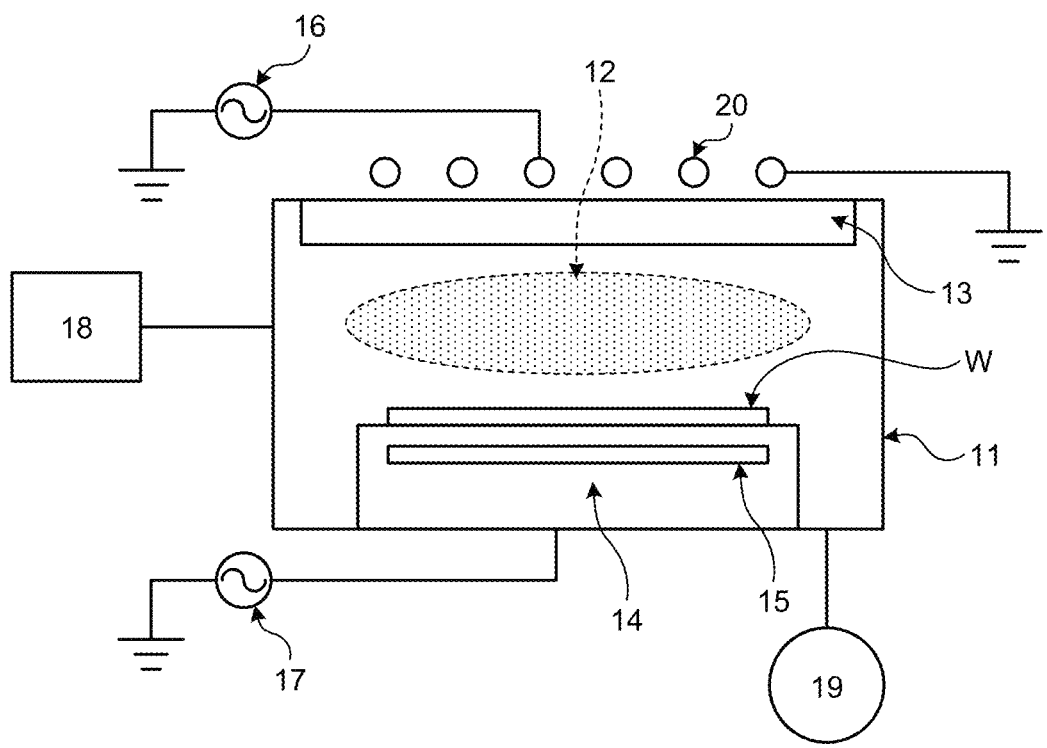
FIG. 3 is a diagram of an exemplary inductively coupled plasma (ICP) apparatus according to the present disclosure.

FIG. 3 schematically illustrates a plasma processing module PM, e.g., an inductively coupled plasma (ICP) plasma system, that couples to the transfer module via a gate valve (not shown). While an ICP system is shown as an example, other plasma processing modules PM may be used as well such a capacitively coupled plasma (CCP) apparatus and the like. The apparatus includes a reaction chamber 11, a dielectric (e.g., quartz) window 13, and a lower electrode 14. An inductive element (coil) 20 is disposed above the dielectric window 13. RF power is coupled to the inductive element 20 and the lower electrode 14 from RF sources 16, 17 respectively. The power coupling may include differing RF frequencies from RF sources 16, 17. The lower electrode 14 includes an electrostatic chuck (ESC) 15 to support and retain a substrate W. A gas source 18 is connected to the chamber 11 to supply various process gases, as will be discussed herein, into the chamber 11. An exhaust device 19 such as a turbo molecular pump (TMP) is connected to the chamber 11 so as to controllably evacuate the chamber 11. Plasma 12 is formed proximate the substrate W between the dielectric window 13 and the lower electrode 14 as the RF power is supplied to at least one of the coil 20 and the lower electrode 14.

In an embodiment, the plasma processing module PM may have dedicated control circuitry (e.g., microcontroller, or computer such as that in FIG. 7) that operates exclusive of in or collaboration with the controller MC (FIG. 1). The controller MC executes a control program stored in memory, and controls each component of the plasma processing module PM based on recipe data stored in the storage device.

FIGS. 4A-4E illustrate of progression of process steps performed on a semiconductor substrate to reliability form a deep etch in a stack while reducing bowing, and while maintaining a uniform critical dimension throughout the deep etch. FIG. 4A is a diagram of substrate that includes an etch layer 101 (e.g., a carbon containing layer), on which a mask 102 is formed. The mask layer 102 is formed with an open area (open portion) OP in which a recess, or etched feature, is to be etched in the etch layer 101, where the recess has a high aspect ratio.

FIG. 4B is a diagram of the substrate after a first etch is performed on the etch layer 101. As a result of the etch, an upper portion (or first portion) of the recess is formed. The etching may be performed with an Oxygen plasma generated from a $O_2$, CO, or $CO_2$ gas, for example. As can be seen, by the difference in height of the mask layer 102 between FIGS. 4A and 4B, part of the mask layer 102 is also removed. Also, an even greater part of the etch layer 101 is removed in the open portion OP of the mask 102.

FIG. 4C is a diagram of the substrate with a first step of a two-step process for forming an ammonium fluorosilicate (AFS) layer, $(NH_4)_2SiF_6$, on the exposed mask surfaces, sidewall, and bottom part of the recess. In FIG. 4C, a silicon oxide, $SiO_x$, is formed by CVD or an atomic layer deposition-like (ALD-like) method. An example CVD process is achieved through the application of a deposition gas such as $SiCl_4$. An example of an ALD-like method includes (1) exposing the substrate to a Si-containing precursor, (2) converting the Si-containing precursor into a thin $SiO_x$ layer 103 by oxidizing the Si-containing precursor, and (3) repeating (1) and (2) until a thickness of the specified $SiO_x$ layer 103 is achieved. In this embodiment, the ALD method forms a conformal $SiO_x$ layer 103 on the mask layer 102, as well as on the sidewalls and bottom of the recess. As will be discussed, the AFS layer (FIG. 4D) can be formed as a conformal or sub-conformal layer.

The second step in forming the AFS layer 104 (FIG. 4D) transforms the $SiO_x$ layer 103 into the AFS layer 104, which includes forming $NH_xF_y$ plasma from $NH_3/NF_3$, $H_2/N_2$, or $SF_6/H_2/N_2$ gases, and then exposing the $SiO_x$ layer to the plasma to form the AFS layer 104. The AFS layer 104 serves as a sidewall protection layer, or film, that protects against further etching of the upper portion of the sidewalls while continuing to deepen the recess via further etching of the etch layer 101. A thickness of the AFS layer 104 is related to a temperature of the substrate. To avoid too thin of a AFS layer 104, a typical substrate temperature is maintained at 50° C., although the temperature could be higher as long as it does not pass 100° C. where sublimation of the AFS begins to occur.

FIG. 4E is a diagram of the substrate after a subsequent etching of the substrate. As shown, the flat portions of the AFS layer 104 are removed and the mask layer 102 is reduced by the etching. Furthermore, the depth of the recess is increased significantly (i.e., through the formation of the second portion of the recess with results from the etching of the bottom surface of the first portion of the etch feature formed in the initial etch of FIG. 4B) as a result of the etch, but the upper portions of the sidewalls are protected against bowing due to the presence of the AFS (or protective layer) on the upper portion (first portion) of the sidewalls. Moreover, the AFS layer 104 is largely unaffected by the ionic bombardment of particles in the open portion OP during the etching process. AFS is highly sublimable. Hence, when high electron-ionization ions collide, AFS is easily removed. Moreover, ions collide with the bottom surface at a nearly vertical angle (90 degrees), while they collide with the sidewalls at a sharp angle. Hence, AFS on the bottom is easily removed, while AFS on the sidewalls tends to remain due to the higher energy imparted by the ions on the bottom than on the sidewalls.

Meanwhile, AFS has a high resistance to radicals, thus serving as a protection of the sidewall. Upon completion of the deep etch, a temperature in the reactor is set to over 100° C. so as to sublimate the portion of the AFS layer 104 that remains on the sidewalls.

Although layer 104 is described in this embodiment as being AFS, it should be understood that layer 104 more generally is a protective layer that protects the sidewall from lateral etching (and associated bowing) while the bottom of the recess is being removed with vertical etching. More generally, protective layer 104 may be made from AFS, or other materials, and can be made without using plasma. For example, in an alternative embodiment, the protective layer 104, whether AFS or other material, is formed by exposing the etch layer 101 to gases such as HF, $NH_3$. In this alternative embodiment, the $SiO_x$ layer 103 (e.g., $SiO_2$ layer) is etched by a gas species including N, F, and H, and as a consequence the protective layer 104, of AFS for example, is formed on the sidewall. Alternatively, when a layer containing SiN, for example, or a multi-layer structure of SiO/SiN, is etched by a species including F and H, a protective layer of AFS, for example, is formed during the etching.

Regarding the protective layer 104, under a condition that a layer containing $SiO_2$ (whether the layer is formed separately as in FIGS. 4A-4E, or whether the etch layer itself is $SiO_2$, as will be discussed with respect to FIGS. 5A-5D) is exposed to a reactive species such as N, F, and H, in addition to the protective layer including AFS, a protective layer of another composition may be formed. The other compositions may include, for example, N and Si; H and Si; N, F and Si; and N, H, F and Si. Under a condition where the $SiO_x$ layer is also formed on the mask (e.g., the embodiment of FIGS. 4A-4E), and this $SiO_x$ layer is exposed to a reactive species of N, F, and H, a layer of AFS may be formed on the mask, which may serve to protect the mask during subsequent etching.

FIGS. 5A-5D illustrate a progression of the substrate as a series of process steps are performed on the substrate according to a second embodiment. The second embodiment is directed to an etch layer that is $SiO_x$, while the first embodiment was directed to etch layers formed of materials other than $SiO_x$. While the example shown in the second embodiment will form a sub-conformal AFS, as will be discussed, it should be understood that both embodiments can form conformal or sub-conformal AFS. Example processes for forming sub-conformal AFS in the first embodiment and second embodiments will be discussed after the discussion below of FIGS. 5A-5D with respect to the second embodiment.

FIG. 5A is a diagram of substrate that includes the etch layer 101 (e.g., a $SiO_x$ layer), on which the mask 102 is formed. The mask layer 102 is formed with an open portion OP in which an etched feature (e.g., a hole, or recess) is to be etched with a high aspect ratio. Examples of the materials used to make the mask layer 102 include carbon, metal, polysilicon and other materials that have sufficient etch selectivity with $SiO_x$, which is the etch layer 101 in this embodiment.

FIG. 5B is a diagram of the substrate after an initial etch (first portion of the recess) is performed on the etch layer 101, $SiO_x$, is performed. The etching may be performed with, for example, a $C_wT_z$ (fluorocarbon) plasma from $C_xF_y$ (fluorocarbon) gas. As can be seen by the difference in height of the mask layer 102 between FIGS. 5A and 5B, part of the mask layer 102 is removed. Also, an even greater part of the etch layer 101 is removed in the open portion OP to create the second portion of the recess.

FIG. 5C is a diagram of the substrate where an AFS layer 110 is formed on a sidewall surface of the etched feature (a recess, in this embodiment). The AFS layer 110 is formed on the sidewall surface of the recess by forming $NH_3/NF_3$, $H_2/N_2$, or $SF_6/H_2/N_2$ gases. Note that the etch layer is formed of $SiO_x$, and thus the AFS layer 110 is mainly formed on the sidewall surfaces of the $SiO_x$. The AFS sub-conformal layer 110 functions as a sidewall protection layer or film for subsequently etching of the recess.

FIG. 5D is a diagram of the substrate after a subsequent etching of the substrate to form the bottom portion (second portion) of the recess. As shown, the flat portions of the mask layer 102 are reduced by the etching. Furthermore, the depth of the recess is increased significantly as a result of the etch, but the upper portions of the sidewalls are protected against bowing due to the presence of the AFS film 110 on the sidewalls, which is largely unaffected by the ionic bombardment of particles in the open portion OP during the etching process. As discussed above, AFS on the bottom is easily removed, while AFS on the sidewalls tends to remain due to the geometric advantage of high energy ions impacting directly on the bottom, while merely glancing off the sidewalls.

Meanwhile, AFS has a high resistance to radicals, thus serving as a protection of the sidewall. Upon completion of the deep etch (which may be one or more etches performed after the AFS layer is formed), a temperature in the reactor is set to over 100° C. so as to thermally anneal the structure to sublimate the portion of the AFS layer 110 that remains on the sidewalls. Regarding the first and second embodiments, it should be noted that multiple steps may be repeated of AFS formation and then etching of the etch layer 101.

Regarding the formation of sub-conformal AFS on the sidewalls of the recess, two examples are provided below. The first example may be applied to the first embodiment (etch layer other than $SiO_x$) and the second example may be applied to the first (etch layer other than $SiO_x$) and second embodiment (etch layer includes $SiO_x$).

As the first example of sub-conformal AFS formation for the first embodiment, first a step of forming a sub-conformal $SiO_x$ layer is performed. This may be accomplished with either (i) regulating an adsorbed area (in this case the top and sidewall of the recess) with the Si-containing precursor and exposure of the area with oxygen plasma until a desired thickness is achieved without substantial thickness at the bottom of the recess or (ii) adsorb the Si-precursor on all surfaces with a reduced amount of exposure time, with respect to (i) of the oxygen plasma. In (i) and (ii) the net effect is the preferential creation of $SiO_x$ on the sidewalls (and top) of the mask, which less, or no, $SiO_x$ formation at the bottom of the recess. Regardless if process (i) or (ii) is performed, the sub-conformal $SiO_x$ layer is converted to sub-conformal AFS by exposing the $SiO_x$ to $NH_xF_y$ plasma, as previously discussed.

As the second example of sub-conformal AFS formation for either the first embodiment or the second embodiment, the processing includes a controlled lesser $NH_xF_y$ plasma exposure to the $SiO_x$. Examples of the lesser $NH_xF_y$ exposure include (i) stopping exposing the $SiO_x$ layer to $NH_xF_y$ plasma before the $SiO_x$ on the bottom surface of the recess is converted to AFS, and (ii) supplying $NH_xF_y$ plasma to the $SiO_x$ layer so not all of the $SiO_x$ layer on the sidewall and/or bottom are converted to AFS.

Example Process Conditions for Etching an Etch Layer 101.

| | |
|---|---|
| Etch Gas for $SiO_x$ etch layer, $SiO_x$/SiN stack, or $SiO_x$/polysilicon stack | Gas includes $C_xF_y$ (optional $O_2$, CHF, or inert gas) |
| Etch Gas for an organic layer | $O_2$ or CO can be used |
| RF Power | 2 kW @ 40 MHz, for plasma generation, 5 KW or greater @ 400 kHz for substrate bias, for a 300 mm wafer |
| Chamber Pressure | <500 mTorr |
| Substrate temperature | <100° C., during etching to avoid AFS sublimation |

Example Process Conditions for First Step ($SiO_x$ Layer Formation, in Embodiment 1).

| | |
|---|---|
| Process gases for ALD-like method | Precursor gas: aminosilane (with or without plasma) and Oxygen activation (optional purge of process volume with an inert gas between the supply of precursor gas and the oxygen activation) |
| Process gases for CVD method | Plasma generation using $SiCl_4$ and optional inert gas, such as Ar |
| Substrate temperature | <100° C., to avoid AFS sublimation |

Example Process Conditions for Conversion of $SiO_x$ to AFS.

| | |
|---|---|
| Process gases for AFS formation | $NH_xF_y$ plasma generation from $NH_3/NH_3$, $H_3/N_2$, or $SF_6/H_2/N_2$ |
| Substrate temperature | <100° C., such as 50° C., to avoid AFS sublimation, |

Figure 6:
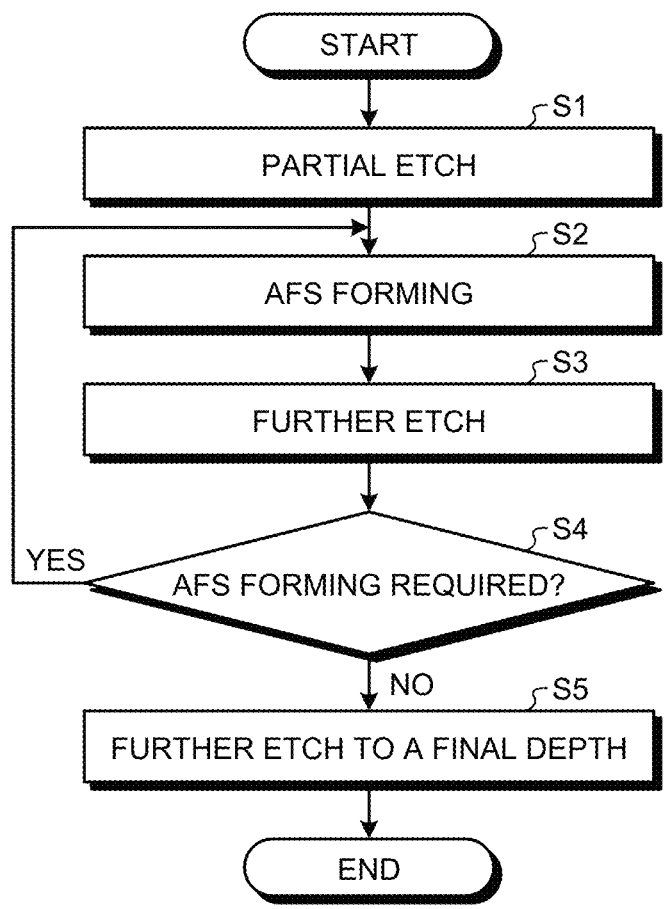
FIG. 6 is a flowchart of an exemplary process flow performed according to the teachings of the present disclosure.

FIG. 6 is a flowchart of a process of performing a high aspect ratio etching process using an AFS protection layer formed at least on the recess's sidewalls performed according to the present disclosure. The process is performed according to either the first embodiment or the second embodiment. Prior to the process show in FIG. 6, a substrate is obtained with an etch layer and a mask layer having an open portion OP where the recess is to be formed. As a result of this initial setup a structure like that shown in FIGS. 4A or 5A is obtained. The process begins in step S1, where a partial etch is performed in the open portion OP such that a structure like that shown in FIGS. 4B and 5B is obtained. As a result, an upper (or first) portion of the recess is created. Then the process proceeds to step S2 where a conformal or sub-conformal AFS is formed at least on the sidewalls of the first portion of the recess, as discussed above. A resultant structure is like that shown in FIGS. 4D (conformal), and 5C (sub-conformal). Once the AFS is formed, the process proceeds to step S3, where a further etch is performed (see FIGS. 4E and 5D) to create the second portion (lower portion) of the recess. The integrity of the critical dimension of the recess is maintained with the assistance of the AFS on the sidewalls of the recess protecting the sidewalls from becoming bowed by over-etching, which is a problem of associated with conventional HAR etch processes.

Then a query is performed in step S4 regarding whether additional AFS formation is required to further protect the sidewalls before a subsequent etching step is performed. If an insufficient amount of AFS remains on the sidewalls to protect the sidewalls during a subsequent etching step, then the process returns to step S2, where additional AFS is formed on the sidewalls. However, if in step S4 it is determined that the amount of AFS is sufficient to protect the sidewalls during further etching until a final depth is reached, the process proceeds to step S5, where the etching continues until the final depth is achieved. Subsequently, any residual AFS may be removed by heating the reactor chamber to above 100° C. to sublimate the AFS. The query may be controlled by a computer-based process where a number of etching steps is recorded in a recipe and the process relies on the controller MC to keep track of the number of etch steps so it can determine whether the present iteration of etch steps is such that no additional AFS needs to be performed. For example, if 6 total etch steps are required to make the high aspect ratio recess, the controller MC keeps track of the number of etch steps and thus will know that the remaining 1, 2, or 3 etch steps (for example) can performed without further supplementing the AFS on the sidewalls of the hole.

Figure 2:
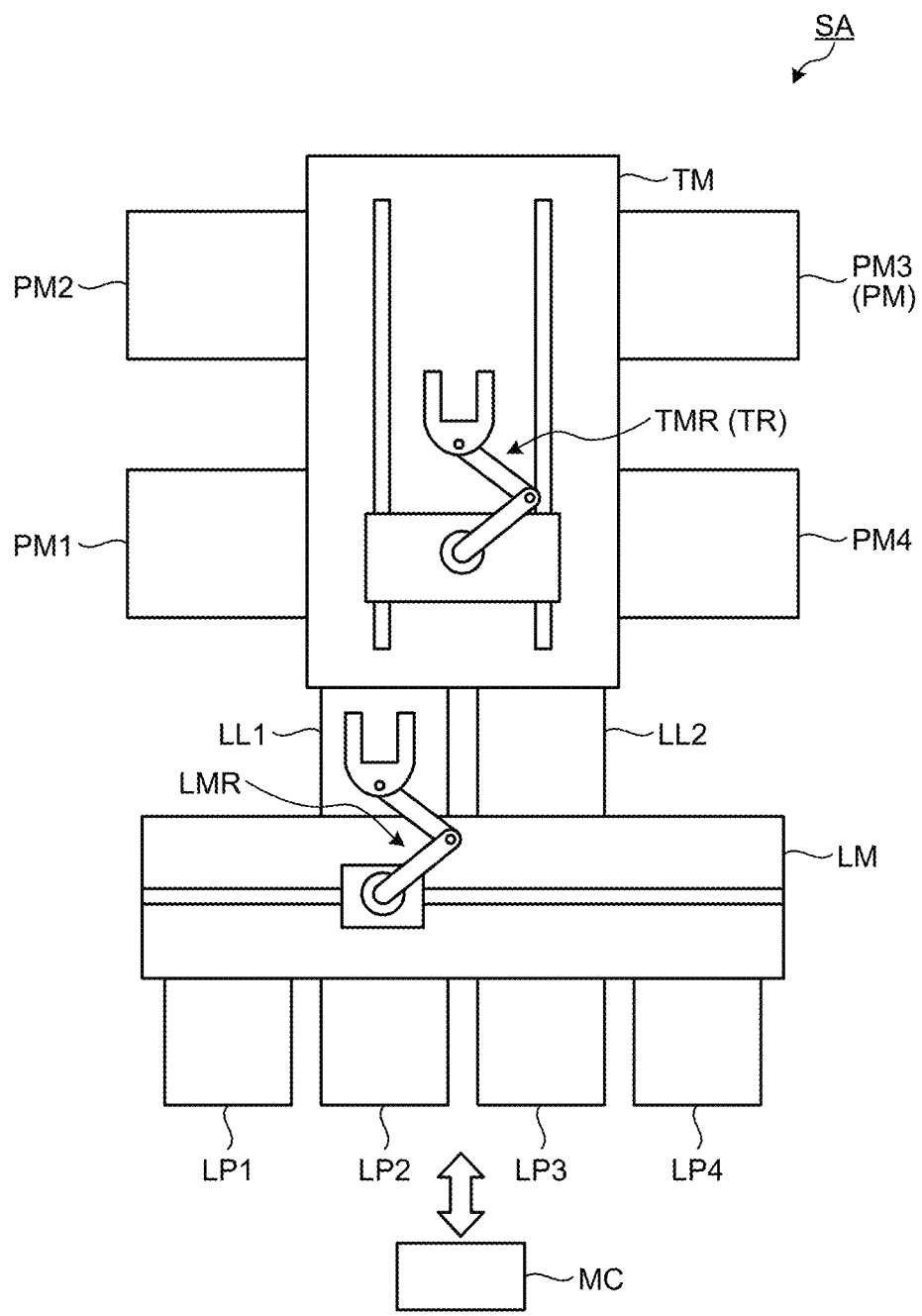
FIG. 2 is a diagram of an exemplary substrate processing apparatus (SA), or plasma processing (etching) system according to the present disclosure.

FIG. 7 is a diagram of processing circuitry for performing computer-based operations described herein, especially with regard to controller MC (FIG. 2). FIG. 7 illustrates control circuitry 130 that may be used to control any computer-based control processes, such as process recipes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 7, the processing circuitry 130 includes a CPU 1200 which performs one or more of the control processes described above/below. The process data and instructions may be stored in memory 1202. These processes and instructions may also be stored on a storage medium disk 1204 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 130 communicates, such as a server or computer.

Further, the claimed advancements may be provided as a utility application, background daemon, or component of an operating system, or combination thereof, executing in conjunction with CPU 1200 and an operating system such as Microsoft Windows, UNIX, Solaris, LINUX, Apple MAC-OS and other systems known to those skilled in the art.

The hardware elements in order to achieve the processing circuitry 130 may be realized by various circuitry elements. Further, each of the functions of the above described embodiments may be implemented by circuitry, which includes one or more processing circuits. A processing circuit includes a particularly programmed processor, for example, processor (CPU) 1200, as shown in FIG. 7. A processing circuit also includes devices such as an application specific integrated circuit (ASIC) and conventional circuit components arranged to perform the recited functions.

In FIG. 7, the processing circuitry 130 includes a CPU 1200 which performs the processes described above. The processing circuitry 130 may be a general-purpose computer or a particular, special-purpose machine. In one embodiment, the processing circuitry 130 becomes a particular, special-purpose machine when the processor 1200 is programmed to perform ESC in-situ replacement by controlling voltages and robot arms to replace the ESC without exposing the reaction chamber to an external atmosphere.

Alternatively, or additionally, the CPU 1200 may be implemented on an FPGA, ASIC, PLD or using discrete logic circuits, as one of ordinary skill in the art would recognize. Further, CPU 1200 may be implemented as multiple processors cooperatively working in parallel to perform the instructions of the inventive processes described above.

The processing circuitry 130 in FIG. 7 also includes a network controller 1206, such as an Intel Ethernet PRO network interface card from Intel Corporation of America, for interfacing with network 1228. As can be appreciated, the network 1228 can be a public network, such as the Internet, or a private network such as an LAN or WAN network, or any combination thereof and can also include PSTN or ISDN sub-networks. The network 1228 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 130 further includes a display controller 1208, such as a graphics card or graphics adaptor for interfacing with display 1210, such as a monitor. A general purpose I/O interface 1212 interfaces with a keyboard and/or mouse 1214 as well as a touch screen panel 1216 on or separate from display 1210. General purpose I/O interface also connects to a variety of peripherals 1218 including printers and scanners.

The general-purpose storage controller 1224 connects the storage medium disk 1204 with communication bus 1226, which may be an ISA, EISA, VESA, PCI, or similar, for interconnecting all of the components of the processing circuitry 130. A description of the general features and functionality of the display 1210, keyboard and/or mouse 1214, as well as the display controller 1208, storage controller 1224, network controller 1206, sound controller 1220, and general purpose I/O interface 1212 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

ELEMENT REFERENCE NUMERALS

LLx Load Lock Chamber x
LM Loader Module
LMR Loader Robot Module
LPx Load Port x
MC Controller (Microcontroller, local or remote computer)
PMx Plasma Module x
R1 Region 1
SA Substrate Processing Apparatus
TM Transfer Module
TMR(TR) Transfer Robot Module
W Wafer
6 Radio Frequency (RF) Source
7 RF Source
8 Gas Source
9 Exhaust Device
10 Variable Direct Current (DC) Power Source
11 Reaction Chamber
12 Plasma
13 Dielectric Window
14 Lower Electrode
15 Electrostatic Chuck
16, 17 RF Sources
18 Gas Source
19 Exhaust Device
20 Inductive Element (Coil)
101, 201 Etch Layer
102, 202 Mask
103 SiOx layer
104, 110 AFS layer (film)

The invention claimed is:

1. A method of etching a substrate, comprising:
etching the substrate to form a first portion of a recess in the substrate, the first portion of the recess including a bottom surface and a sidewall;
forming an ammonium fluorosilicate (AFS) layer in or on the sidewall; and
after the forming, etching the bottom surface to form a second portion of the recess while protecting the sidewall with the AFS layer, wherein the second portion is below the first portion of the recess.

2. The method of claim 1, wherein the forming and the etching the bottom surface are performed at a temperature that is less than 100° C.

3. The method of claim 1, wherein the forming includes forming the AFS layer on a surface of the sidewall of the first portion of the recess.

4. The method of claim 3, wherein the forming further comprising:
exposing the surface of the sidewall to a Si-containing precursor to form a precursor layer on the surface of the sidewall;
exposing the precursor layer to an oxygen plasma to oxidize the precursor layer and form a $SiO_2$ layer; and
exposing the $SiO_2$ layer to a plasma containing N, F, and H species.

5. The method of claim 1, wherein the forming includes forming the AFS layer in the sidewall of the first portion of the recess.

6. The method of claim 1, wherein
the substrate includes $SiO_2$, and
the forming includes exposing the $SiO_2$ layer to a plasma containing N, F, and H species.

7. The method of claim 1, wherein
the substrate includes a mask layer with an open portion, and
the etching the substrate includes at least one of
etching the substrate in the open portion of the mask, and
etching the bottom surface of the first portion of the recess in the open portion of the mask.

8. The method of claim 1, wherein the method further comprises repeating the forming and the etching the bottom surface.

9. The method of claim 1, further comprising:
after the etching the bottom surface, heating the substrate to above 100° C. to remove the AFS layer.

10. The method of claim 1, wherein the substrate includes a stack comprising alternating layers of $SiO_x$ and SiN.

11. The method of claim 1, wherein the substrate includes a stack comprising alternating layers of $SiO_x$ and polysilicon.

12. The method of claim 1, wherein the forming and the etching the bottom surface are performed in a same reaction chamber.

13. The method of claim 1, wherein
the forming is performed in a first reaction chamber, and
the etching the bottom surface is performed in a second reaction chamber, the second reaction chamber being different than the first reaction chamber.

14. The method of claim 1, wherein the forming includes forming the AFS layer as a conformal layer that covers at least the sidewall of the first portion of the recess.

15. The method of claim 1, wherein forming includes forming the AFS layer as a sub-conformal layer that extends along the sidewall from an upper surface of the substrate to the bottom surface of the first portion of the recess.

16. A method of etching a substrate, comprising:
etching the substrate to form a first portion of a recess in the substrate, the first portion of the recess including a bottom surface and a sidewall;
protecting the sidewall with an ammonium fluorosilicate (AFS) layer; and etching the bottom surface to form a second portion of the recess while protecting the sidewall with the AFS layer, wherein the second portion is below the first portion of the recess.

17. The method of claim 16, wherein the protecting includes protecting the sidewall of the first portion of the etched future while etching the bottom surface so as to prevent bowing of the of the sidewall of the first portion of the recess.

18. A method of etching a substrate, comprising:
etching the substrate to form a first portion of a recess in the substrate, the first portion of the recess including a bottom surface and a sidewall;
forming a protective layer including N, F, H, and Si in or on the sidewall;
after the forming, etching the bottom surface to form a second portion of the recess while protecting the sidewall with the protective layer; and
heating the substrate to above 100° C. to remove the protective layer on the sidewall, wherein the second portion is below the first portion of the recess.

* * * * *